(12) United States Patent
Dribinsky et al.

(10) Patent No.: US 9,887,695 B2
(45) Date of Patent: *Feb. 6, 2018

(54) CIRCUIT AND METHOD FOR CONTROLLING CHARGE INJECTION IN RADIO FREQUENCY SWITCHES

(71) Applicant: Peregrine Semiconductor Corporation, San Diego, CA (US)

(72) Inventors: Alexander Dribinsky, Naperville, IL (US); Tae Youn Kim, Irvine, CA (US); Dylan J. Kelly, San Diego, CA (US); Christopher N. Brindle, Poway, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,360

(22) Filed: Jan. 4, 2016

(65) Prior Publication Data

US 2016/0226478 A1     Aug. 4, 2016

Related U.S. Application Data

(63) Continuation of application No. 14/257,808, filed on Apr. 21, 2014, now Pat. No. 9,397,656, which is a
(Continued)

(51) Int. Cl.
*H01L 29/49*     (2006.01)
*H03K 17/16*     (2006.01)
(Continued)

(52) U.S. Cl.
CPC ......... *H03K 17/161* (2013.01); *H03K 17/102* (2013.01); *H03K 17/284* (2013.01);
(Continued)

(58) Field of Classification Search
CPC ... H03K 17/161; H03K 17/102; H03K 17/284
See application file for complete search history.

(56) References Cited

U.S. PATENT DOCUMENTS

| 4,883,976 A | 11/1989 | Deane |
| 5,973,364 A | 10/1999 | Kawanaka |

(Continued)

FOREIGN PATENT DOCUMENTS

| EP | 2387094 | 11/2011 |
| EP | 3113280 | 1/2017 |

(Continued)

OTHER PUBLICATIONS

Hoffmann, et al., Communication under Rule 71(3) received from the EPO dated Dec. 1, 2016 for appln. No. 06786943.8, 4 pgs.

(Continued)

*Primary Examiner* — Michael Shingleton
(74) *Attorney, Agent, or Firm* — Jaquez Land Greenhaus LLP; Martin J. Jaquez, Esq.; John Land, Esq.

(57) ABSTRACT

A circuit and method for controlling charge injection in a circuit are disclosed. In one embodiment, the circuit and method are employed in a semiconductor-on-insulator (SOI) Radio Frequency (RF) switch. In one embodiment, an SOI RF switch comprises a plurality of switching transistors coupled in series, referred to as "stacked" transistors, and implemented as a monolithic integrated circuit on an SOI substrate. Charge injection control elements are coupled to receive injected charge from resistively-isolated nodes located between the switching transistors, and to convey the injected charge to at least one node that is not resistively-isolated. In one embodiment, the charge injection control elements comprise resistors. In another embodiment, the charge injection control elements comprise transistors. A method for controlling charge injection in a switch circuit is disclosed whereby injected charge is generated at resis- (Continued)

tively-isolated nodes between series coupled switching transistors, and the injected charge is conveyed to at least one node of the switch circuit that is not resistively-isolated.

48 Claims, 8 Drawing Sheets

Related U.S. Application Data continuation of application No. 11/881,816, filed on Jul. 26, 2007, now abandoned, which is a continuation-in-part of application No. 11/520,912, filed on Sep. 14, 2006, now Pat. No. 7,890,891, and a continuation-in-part of application No. 11/484,370, filed on Jul. 10, 2006, now Pat. No. 7,910,993, said application No. 11/881,816 is a continuation-in-part of application No. 11/484,370.

(60) Provisional application No. 60/718,260, filed on Sep. 15, 2005, provisional application No. 60/698,523, filed on Jul. 11, 2005, provisional application No. 60/833,562, filed on Jul. 26, 2006.

(51) Int. Cl.
| | | |
|---|---|---|
| H03K 17/10 | (2006.01) | |
| H03K 17/284 | (2006.01) | |
| H03K 17/687 | (2006.01) | |
| H03K 17/689 | (2006.01) | |
| H03K 17/04 | (2006.01) | |
| H03K 17/06 | (2006.01) | |
| H03K 17/08 | (2006.01) | |

(52) U.S. Cl.
CPC ....... *H03K 17/689* (2013.01); *H03K 17/6874* (2013.01); *H03K 17/04* (2013.01); *H03K 17/06* (2013.01); *H03K 17/08* (2013.01); *H03K 2217/0009* (2013.01)

(56) References Cited

U.S. PATENT DOCUMENTS

| | | | |
|---|---|---|---|
| 6,355,957 | B1 | 3/2002 | Maeda et al. |
| 6,573,533 | B1 | 6/2003 | Yamazaki |
| 6,804,502 | B2 * | 10/2004 | Burgener ............... H01P 1/15 257/341 |
| 6,901,023 | B2 | 5/2005 | Kirsch et al. |
| 9,087,899 | B2 | 7/2015 | Brindle et al. |
| 9,130,564 | B2 | 9/2015 | Brindle et al. |
| 9,225,378 | B2 | 12/2015 | Burgener et al. |
| 9,397,656 | B2 * | 7/2016 | Dribinsky ............ H03K 17/102 |
| 9,608,619 | B2 | 3/2017 | Stuber et al. |
| 9,653,601 | B2 | 5/2017 | Brindle et al. |
| 9,780,775 | B2 | 10/2017 | Brindle et al. |
| 9,780,778 | B2 | 10/2017 | Burgener et al. |
| 9,786,781 | B2 | 10/2017 | Brindle et al. |
| 2004/0218442 | A1 | 11/2004 | Kirsch et al. |
| 2008/0034335 | A1 | 2/2008 | Cheng et al. |
| 2009/0007036 | A1 | 1/2009 | Cheng et al. |
| 2015/0022256 | A1 | 1/2015 | Sprinkle et al. |
| 2017/0162692 | A1 | 6/2017 | Brindle et al. |
| 2017/0236946 | A1 | 8/2017 | Stuber et al. |

FOREIGN PATENT DOCUMENTS

| | | |
|---|---|---|
| EP | 1902474 | 4/2017 |
| JP | 2000058842 | 2/2000 |
| JP | 2001094114 | 6/2001 |
| JP | 6006219 | 9/2016 |
| WO | 2007/008934 | 1/2007 |
| WO | 2007008934 | 1/2007 |

OTHER PUBLICATIONS

Tieu, Binh Kien, Final Office Action received from the USPTO dated May 18, 2017 for U.S. Appl. No. 14/883,499, 19 pgs.
Burgener, et al., Response to Final Office Action filed in the USPTO dated May 26, 2017 for U.S. Appl. No. 14/883,499, 3 pgs.
Nguyen, Niki Hoang, Final Office Action received from the USPTO dated Mar. 8, 2017 for U.S. Appl. No. 14/845,154, 28 pgs.
Nguyen, Niki Hoang, Notice of Allowance received from the USPTO dated Apr. 10, 2017 for U.S. Appl. No. 14/845,154, 8 pgs.
Brindle, et al., Response to Final Office Action filed in the USPTO dated Mar. 24, 2017 for U.S. Appl. No. 14/845,154, 3 pgs.
Nguyen, Niki Hoang, Office Action received from the USPTO dated Mar. 24, 2017 for U.S. Appl. No. 15/354,723, 15 pgs.
Burgener, et al., Response to Non-Final Office Action filed in the USPTO dated Feb. 3, 2017 for U.S. Appl. No. 14/883,499, 8 pgs.
Brindle, et al., Preliminary Amendment filed in the USPTO dated Feb. 23, 2017 for U.S. Appl. No. 15/354,723, 7 pgs.
Dribinsky, et al., "Circuit and Method for Controlling Charge Injection in Radio Frequency Switches", patent application filed in the USPTO on Apr. 21, 2014, U.S. Appl. No. 14/257,808, 35 pgs.
Shingleton, Michael, Office Action received from the USPTO dated Apr. 10, 2015 for U.S. Appl. No. 14/257,808, 8 pgs.
Shingleton, Michael, Notice of Allowance received from the USPTO dated Dec. 10, 2015 for U.S. Appl. No. 14/257,808, 176 pgs.
Dribinsky, et al., Amendment filed in the USPTO dated Oct. 13, 2015 for U.S Appl. No. 14/257,808, 19 pgs.
Itoh, Tadashige, et al., English translation of Office Action received from the JPO dated Dec. 1, 2015 for appln. No. 2013-535054, 3 pgs.
Nguyen, Niki Hoang, Office Action received from the USPTO dated Mar. 2, 2016 for U.S. Appl. No. 14/804,198, 5 pgs.
Peregrine Semiconductor Corporation, English translation of a Response that was filed in the JPO dated Mar. 31, 2016 for appln. No. 2013-535054, 7 pgs.
Peregrine Semiconductor Corporation, Response filed in the EPO dated Mar. 30, 2016 for appln. No. 11153227.1, 13 pgs.
Peregrine Semiconductor Corporation, Response filed in the EPO dated Mar. 30, 2016 for appln. No. 11153247.9, 13 pgs.
Peregrine Semiconductor Corporation, Response filed in the EPO dated Mar. 30, 2016 for appln. No. 11153241.2, 15 pgs.
Peregrine Semiconductor Corporation, Response filed in the EPO dated Mar. 30, 2016 for appln. No. 11153281.8, 13 pgs.
Peregrine Semiconductor Corporation, Reply to Summons to Attend Oral Proceedings filed in the EPO dated Apr. 15, 2016 for appln. No. 0678943.8, 26 pgs.
Hoffmann, Niels, Communication pursuant to Article 94(3) EPC received from the EPO dated May 13, 2016 for appln. No. 11153313.9, 4 pgs.
Nguyen, Niki Hoang, Office Action received from the USPTO dated Jun. 1, 2016 for U.S. Appl. No. 14/845,154, 6 pgs.
Brindle, et al., Response filed in the USPTO dated Jun. 2, 2016 for appln. No. 14/804,198, 9 pgs.
Brindle, et al., Response filed in the USPTO dated Apr. 17, 2017 for appln. No. 15/354,723, 9 pgs.
Peregrine Semiconductor Corporation, Response filed in the EPO dated Sep. 6, 2016 for appln. No. 16020116.6, 2 pgs.
Unterberger, Michael, Extended Search Report received from the EPO dated Dec. 6, 2016 for appln. No. 16020116.6, 10 pgs.
Nguyen, Niki Hoang, Notice of Allowance received from the USPTO dated Sep. 23, 2016 for U.S. Appl. No. 14/804,198, 21 pgs.
Eliasson, et al., Datasheet for the Decision of Sep. 29, 2016 received from the EPO dated Sep. 29, 2016 for appln. No. 06786943.8, 15 pgs.
Tieu, Binh Kien, Office Action received from the USPTO dated Oct. 4, 2016 for U.S. Appl. No. 14/883,499, 23 pgs.
Sanchez, Chiquero, Minutes of the Oral Proceedings received from the EPO dated Oct. 10, 2016 for appln. No. 06786943.8, 35 pgs.
Tat, Binh C., Notice of Allowance received from the USPTO dated Oct. 17, 2016 for U.S. Appl. No. 13/948,094, 28 pgs.
Brindle, et al., Response filed in the USPTO dated Oct. 28, 2016 for U.S. Appl. No. 14/845,154, 9 pgs.

(56) References Cited

OTHER PUBLICATIONS

Nguyen, Niki Hoang, Notice of Allowance received from the USPTO dated Dec. 7, 2016 for appln. No. 14/804,198, 12 pgs.

Itoh, et al., Office Action and English translation received from the JPO dated Jun. 27, 2017 for appln. No. 2016-175339, 14 pgs.

Stuber, et al., Preliminary Amendment filed in the USPTO dated Jul. 21, 2017 for appln. No. 15/419,898, 10 pgs.

Sukman-Prahofer, Sibina, English translation of Office Action received from the German Patent Office dated May 18, 2017 for appln. No. 112011103554.3, 8 pgs.

Tieu Binh Kien, Notice of Allowance received from the USPTO dated Jun. 8, 2017 for U.S. Appl. No. 14/883,499, 14 pgs.

Nguyen, Niki Hoang, Notice of Allowance received from the USPTO dated Jun. 21, 2017 for appln. No. 15/354,723, 23 pgs.

Nguyen, Niki Hoang, Notice of Allowance received from the USPTO dated Aug. 9, 2017 for U.S. Appln. No. 14/845,154, 12 pgs.

Nguyen, Niki Hoang, Notice of Allowance received from the USPTO dated Aug. 11, 2017 for U.S. Appln. No. 15/354,723, 18 pgs.

\* cited by examiner

CIRCUIT AND METHOD FOR CONTROLLING CHARGE INJECTION IN RADIO FREQUENCY SWITCHES

CROSS-REFERENCE TO RELATED UTILITY AND PROVISIONAL APPLICATIONS—CLAIMS OF PRIORITY

This application is a continuation of co-pending and commonly assigned U.S. patent application Ser. No. 14/257,808, filed Apr. 21, 2014, entitled "Circuit and Method for Controlling Charge Injection in Radio Frequency Switches", which application Ser. No. 14/257,808 is a continuation of and commonly assigned U.S. patent application Ser. No. 11/881,816, filed Jul. 26, 2007, entitled "Circuit and Method for Controlling Charge Injection in Radio Frequency Switches", which is a Continuation-in-Part (CIP) of commonly assigned U.S. patent application Ser. No. 11/520,912, filed Sep. 14, 2006 (now U.S. Pat. No. 7,890,891 issued Feb. 15, 2011) entitled "METHOD AND APPARATUS IMPROVING GATE OXIDE RELIABILITY BY CONTROLLING ACCUMULATED CHARGE", which claims the benefit under 35 U.S.C. § 119(e) of U.S. Provisional Application No. 60/718,260, filed Sep. 15, 2005; the cited application Ser. No. 11/520,912, filed Sep. 14, 2006, is a CIP of U.S. patent application Ser. No. 11/484,370, filed Jul. 10, 2006 (now U.S. Pat. No. 7,910,993 issued Mar. 22, 2011) entitled "METHOD AND APPARATUS FOR USE IN IMPROVING LINEARITY OF MOSFETS USING AN ACCUMULATED CHARGE SINK", which claims the benefit under 35 U.S.C. § 119(e) of U.S. Provisional Application No. 60/698,523, filed Jul. 11, 2005; CIP application Ser. No. 11/881,816 is also a CIP of the cited U.S. patent application Ser. No. 11/484,370, filed Jul. 10, 2006 (now U.S. Pat. No. 7,910,993 issued Mar. 22, 2011); CIP application Ser. No. 11/881,816 also claims the benefit under 35 U.S.C. § 119(e) of U.S. Provisional Application No. 60/833,562, filed Jul. 26, 2006, entitled "CIRCUIT AND METHOD FOR CONTROLLING CHARGE INJECTION IN RADIO FREQUENCY SWITCHES". The present continuation application is related to each of the applications set forth above. All of the applications and issued patents set forth above are hereby incorporated by reference herein as if set forth in full.

BACKGROUND

1. Field

The present teachings relate to electronic switches, and particularly to a circuit and method for controlling charge injection in semiconductor-on-insulator (SOI) radio frequency (RF) switches.

2. Description of Related Art

Radio frequency (RF) switches for directing RF signals are found in many different RF devices such as televisions, video recorders, cable television equipment, cellular telephones, wireless pagers, wireless infrastructure equipment, and satellite communications equipment. As is well known, the performance of RF switches is controlled by three primary operating performance parameters: insertion loss, switch isolation, and the "1 dB compression point." The "1 dB compression point" is related to, and is indicative of, the linearity performance of an RF switch. Linearity performance is also indicated by the levels of RF signal harmonics generated by an RF switch, particularly at high RF power levels. These three performance parameters are tightly coupled, and any one parameter can be emphasized in the design of RF switch components at the expense of others. A fourth performance parameter that is occasionally considered in the design of RF switches is commonly referred to as the switching time or switching speed (defined as the time required to turn one side of a switch on and turn the other side off). Other characteristics important in RF switch design include ease and degree (or level) of integration of the RF switch, complexity, yield, return loss and cost of manufacture.

Charge injection is a problem that may occur in switching circuits such as SOI RF switches. Charge injection occurs when an applied voltage, such as a gate bias voltage, is connected to a "resistively-isolated node" through a coupling capacitance. A resistively-isolated node is defined herein as a node that at some interval during operation is connected to other circuit elements only through very high resistance connections. For example, a resistively-isolated node may occur at a transistor channel node located between series-connected transistors when the transistors are in an OFF-state. The coupling capacitance through which charge injection occurs may be either a parasitic capacitance of a circuit element (e.g., gate-to-source capacitance in a transistor), or a capacitance associated with a capacitor. For example, a bias voltage applied to the gate of a transistor may be connected to a resistively-isolated source node of the transistor through the gate-to-source capacitance. In general, charge injection may be a problem for many types of switching circuits. In particular, charge injection is significantly deleterious to the performance properties of SOI RF switches. Further, teachings on prior art SOI RF switches do not address this problem, for reasons described in more detail hereinbelow. Consequently, a need exists for a novel circuit and method for controlling charge injection in SOI RF switches.

SUMMARY

A novel circuit and method for controlling charge injection in an SOI RF switch are disclosed. The SOI RF switch may comprise a plurality of switching transistors connected in series (referred to herein as "stacked" switching transistors) implemented as a monolithic integrated circuit (IC) on an SOI substrate. In one embodiment the SOI RF switch is fabricated on an Ultra-Thin-Silicon ("UTSi") substrate, also referred to herein as "silicon on sapphire" (SOS). In another embodiment, the SOI RF switch is fabricated in silicon-on-bonded wafer technology.

In an embodiment according to the present disclosure, an SOI RF switch includes at least one stack comprising a plurality of switching transistors connected in a series circuit. Charge injection control elements are connected to receive injected charge from resistively-isolated nodes located between the switching transistors, and to convey the injected charge to one or more nodes that are not resistively-isolated. Optionally, the charge injection control elements may be connected to receive a control signal for switching the charge injection control elements between ON-states and OFF-states. In one embodiment, each switching transistor in a stack of the SOI RF switch has at least one charge injection control element operatively connected between a source node and a drain node of each switching transistor.

In one embodiment, the charge injection control elements comprise charge injection control resistors. In another embodiment, the charge injection control elements comprise charge injection control transistors connected to receive a control signal for switching the injection control transistors between and ON-state and an OFF-state. The charge injection control transistors are operated so that they are in the ON-state when the switching transistors are in an ON-state. When the switching transistors are switched from the ON-state to an OFF-state, the charge injection control transistors are switched from an ON-state to an OFF-state after a selected delay time interval, thereby allowing the injected charge to be conveyed to the least one node that is not resistively-isolated.

In one embodiment, a method for controlling charge injection includes: 1) causing charge injection to occur at resistively-isolated nodes located between the switching transistors; 2) conveying the injected charge via charge injection control elements to at least one node that is not resistively-isolated; and, 3) optionally switching the charge injection control elements from an ON-state to an OFF-state.

According to one embodiment of the method for controlling charge injection, the charge injection control elements may comprise charge injection control resistors. In another embodiment, the charge injection control elements may comprise charge injection control transistors.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The problems caused by charge injection in SOI RF switches may be described with reference to FIG. 1A. An SOI RF switch 100 comprises stacked switching transistors 111, 113, 115 and 117. As disclosed in commonly-assigned U.S. application Ser. Nos. 10/922,135 and 10/267,531, incorporated by reference hereinabove, RF switches using stacked switching transistors have many performance advantages over prior art RF switches, such as higher RF power capability and reduced generation of harmonics in the switched RF signal. (For further information on stacked switching transistors, see commonly assigned application Ser. No. 10/922,135, filed Aug. 18, 2004, which issued Oct. 17, 2006 as U.S. Pat. No. 7,123,898, and is a continuation application of application Ser. No. 10/267,531, filed Oct. 8, 2002, which issued Oct. 12, 2004 as U.S. Pat. No. 6,804,502, entitled "SWITCH CIRCUIT AND METHOD OF SWITCHING RADIO FREQUENCY SIGNALS"; application Ser. No. 10/267,531 claimed the benefit under 35 U.S.C. §119(e) of U.S. Provisional Application No. 60/328,353, filed Oct. 10, 2001. All of the applications and issued patents set forth in the preceding sentence are hereby incorporated by reference herein as if set forth in full.) Although four stacked switching transistors are shown in FIG. 1A, it will be apparent to persons skilled in the arts of electronic circuits that the present teachings apply to RF switches having an arbitrary plurality of stacked switching transistors.

Figure 1A:
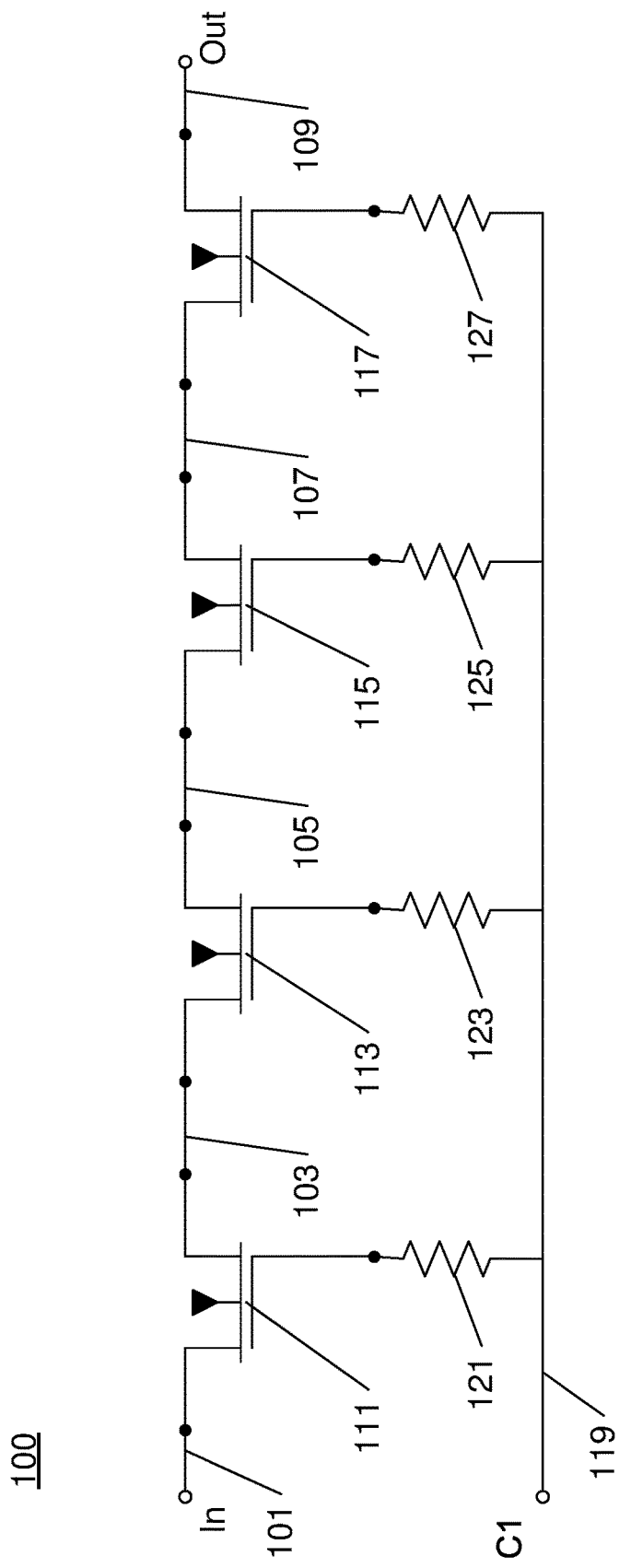
FIG. 1A schematically illustrates an SOI RF switch circuit using stacked switching transistors.

As shown in FIG. 1A, a first channel node of the switching transistor 111 may receive an input RF signal from a node 101. A second channel node of the switching transistor 111 is operatively connected through a node 103 to a first node of the switching transistor 113. A second channel node of the switching transistor 113 is operatively connected through a node 105 to a first channel node of the switching transistor 115. A second channel node of the switching transistor 115 is operatively connected through a node 107 to a first channel node of the switching transistor 117. A second channel node of the switching transistor 117 is connected to a node 109, which may output an RF signal. Typically, the nodes 101 and 109 are connected to load impedances (not shown) having resistance values to ground on the order of 50 or 75 ohms.

Gate nodes of the switching transistors 111, 113, 115 and 117 are separately connected to gate resistors 121, 123, 125 and 127, respectively. As disclosed in U.S. application Ser. Nos. 10/922,135 and 10/267,531, the gate resistors are included to enable voltage division of RF signals across the switching transistors, protect bias circuits, and prevent transmission of parasitic RF signals between the stacked switching transistors. In some embodiments, the resistance Rg of each gate resistor should be at least ten times larger than the RF impedance of the gate-to-drain capacitance Cgd of the switching transistor to which it is connected. The gate resistors 121, 123, 125 and 127 are jointly connected to a gate control line 119 to receive a gate control signal C1.

The operation and advantages of RF switches such as the SOI RF switch 100 have been previously disclosed, as for example in U.S. application Ser. Nos. 10/922,135 and 10/267,531. However, the charge injection problem and solution have not been previously disclosed. In the present example, as illustrated by FIG. 1A, charge injection may occur at the nodes 103, 105 and 107 in the following manner. For the present example, the switching transistors 111, 113, 115 and 117 comprise enhancement-mode n-channel Metal-Oxide-Semiconductor Field Effect Transistors (MOSFETs) with a threshold voltage of +0.3 V. The gate control signal C1 is varied between a voltage of +3.0 V wherein the switching transistors are ON, and a voltage of −3.0 V wherein the switching transistors are OFF.

When the gate control signal C1 changes from +3 V to −3 V, the voltage passes through the switching transistor threshold voltage +0.3 V. During this process, the switching transistors 111 and 117 will switch from ON to OFF without difficulty because the nodes 109 and 101 are connected to load resistors (not shown) and therefore have an average DC potential at approximately ground potential or 0 V. The first channel node of the switching transistor 111 and the second channel node of the switching transistor 117 will be at a DC bias voltage of approximately 0 V, and their respective gate nodes will be a voltage of −3 V. However, when the switching transistors 111 and 117 switch from ON to OFF, the nodes 103, 105 and 107 become resistively isolated, as defined hereinabove in paragraph 004. For this reason, charge injection through the gate-to-channel capacitances of the switching transistors 113 and 115 to the nodes 103, 105 and 107 will occur as the control signal C1 voltage moves from the threshold voltage of +0.3 to −3 V. The charge injection will tend to maintain the nodes 103, 105 and 107 at voltages that may be only slightly more positive than the control signal C1 voltage. This will prevent the channels of the transistors 103, 105 and 107 from achieving a highly depleted condition, which is required for proper operation of the SOI RF switch 100.

Figure 1B:
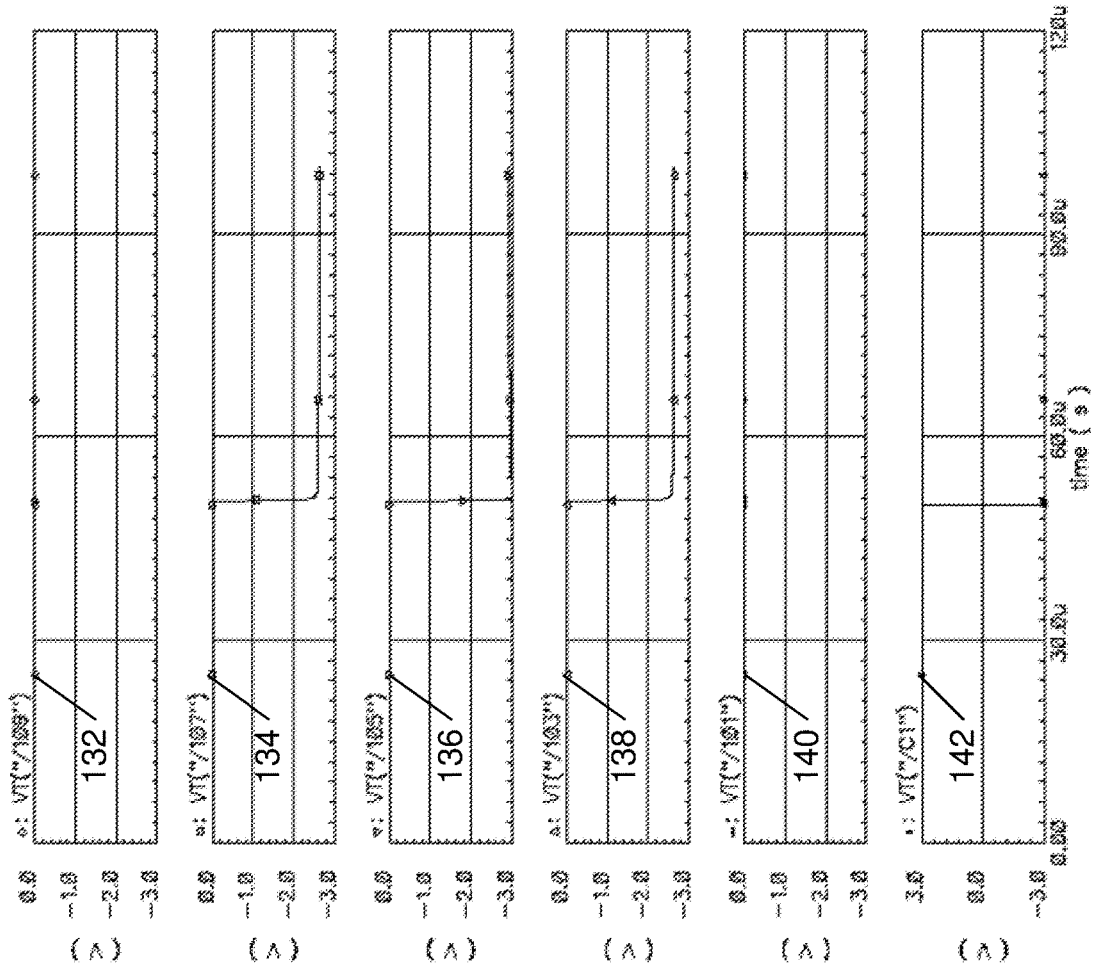
FIG. 1B illustrates the effects of charge injection in an SOI RF switch circuit using stacked switching transistors.

These effects are illustrated in FIG. 1B by simulated data for the SOI RF switch 100. When a control voltage 142 (C1) is switched from +3 V to −3 V, voltages 134, 136 and 138 on nodes 107, 105 and 103, respectively, follow the voltage 142 as described above. Voltages 132 and 140 on nodes 109 and 101, respectively, remain at 0 V because they are not resistively isolated.

Prior art teachings are not informed regarding the problem of charge injection as described above. The principal reason for this is that RF switches such as SOI RF switch 100 are typically used to switch RF signals of several volts AC amplitude. If some of the switching transistors are not in a strong OFF-state, the RF signals will cause breakdown effects in the switching transistors that are strongly turned OFF and therefore receive larger RF signal voltages. These breakdown effects remove the injected charge from the resistively-isolated nodes, thereby enabling the switches to operate after a time interval. However, the breakdown effects may have deleterious effects on the reliability of the switching transistors. Further, because the breakdown effects occur over a time interval, the performance of the RF switch is adversely affected during the time interval. In particular, during the time interval wherein the injected charge is not completely removed, the switch response becomes nonlinear, and undesirable RF harmonics may be generated by the SOI RF switch.

Figure 1C:
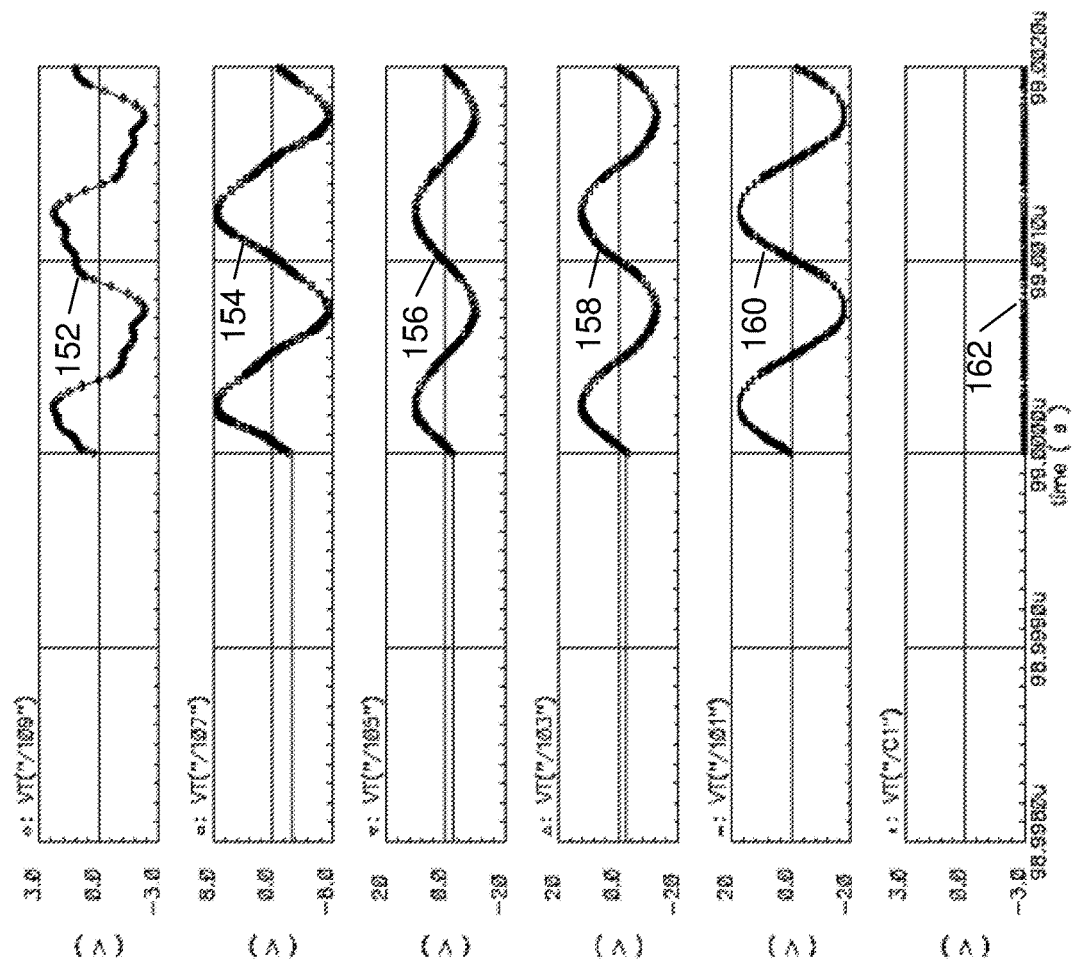
FIG. 1C illustrates simulated data for the RF switch of FIG. 1A wherein the RF switch has recently been switched from an ON-state to an OFF-state.

These deleterious effects are illustrated in FIG. 1C by simulated data for the SOI RF switch 100 that has been recently switched from the ON-state to the OFF-state. At a time 99.0000 microseconds, an RF signal 160 is applied at the node 101. RF signals 158, 156, 154 and 152 appear at nodes 103, 105, 107 and 109, respectively, due to parasitic coupling effects. Persons skilled in the electronic arts will recognize from the distorted waveforms seen in the RF signals 158, 156, 154 and 152 that significant nonlinear distortion is present during the time interval illustrated, which corresponds to a time when charge injection effects are present. These deleterious effects due to charge injection can be reduced or eliminated according to the teachings herein.

SOI RF Switch with a Charge Injection Control Circuit.

Figure 2:
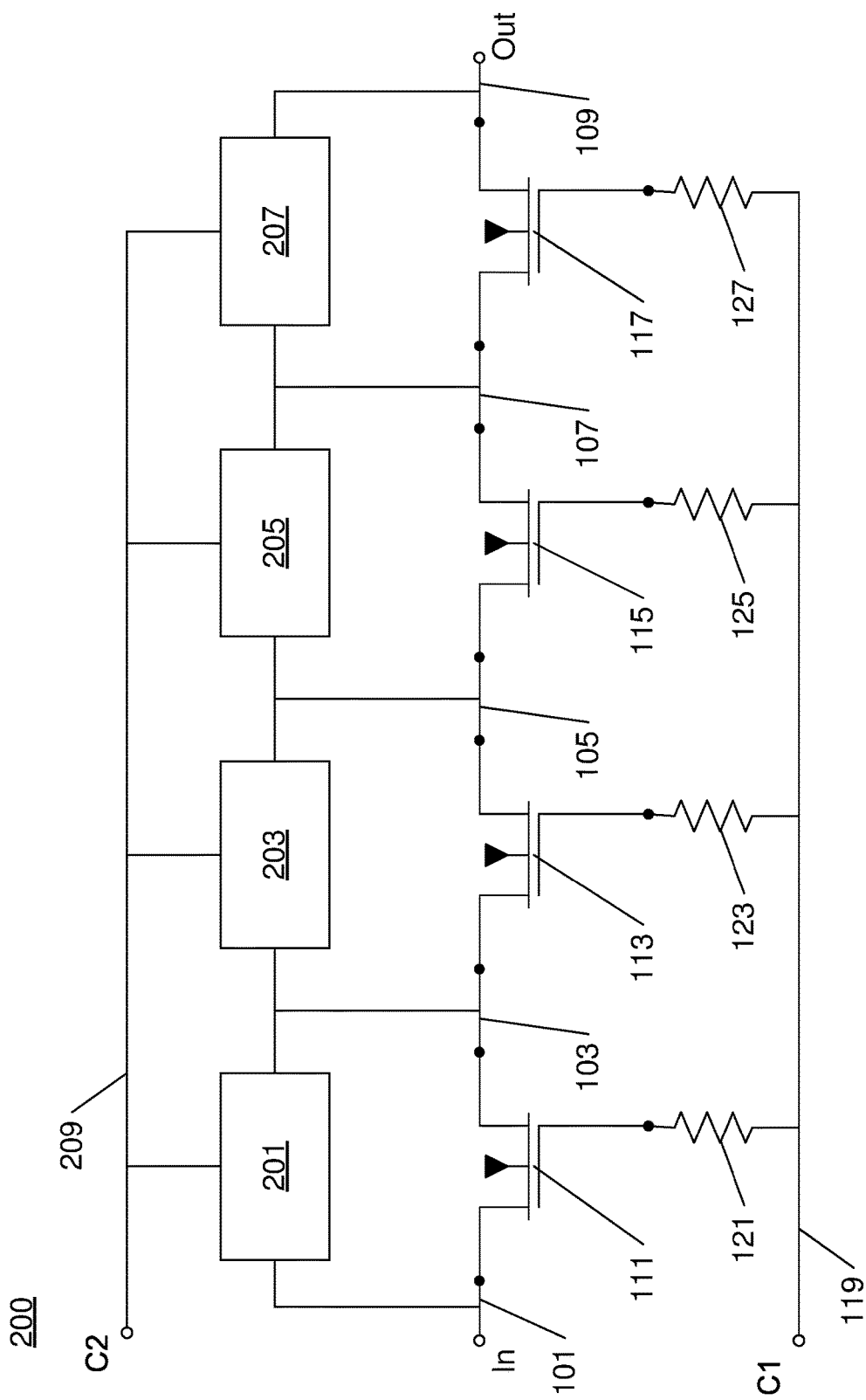
FIG. 2 schematically illustrates an embodiment according to the present disclosure, including a charge injection control circuit.

An embodiment of a charge injection control circuit to remove injected charge in an SOI RF switch is illustrated by FIG. 2.

In FIG. 2, an SOI RF switch 200 includes charge injection control elements 201, 203, 205 and 207 that comprise elements of a charge injection control circuit. A first and second channel node of the charge injection control element 201 are operatively connected to the nodes 101 and 103, respectively. A first and second channel node of the charge injection control element 203 are operatively connected to the nodes 103 and 105, respectively. A first and second channel node of the charge injection control element 205 are operatively connected to the nodes 105 and 107, respectively. A first and second channel node of the charge injection control element 207 are similarly operatively connected to the nodes 107 and 109, respectively. Optionally (e.g., as described below in reference to FIG. 4), the charge injection control elements 201, 203, 205 and 207 may be connected to a control line 209 to receive a control signal C2.

The charge injection control elements 201, 203, 205 and 207 receive injected charge from the nodes 103, 105 and 107, and selectively convey the injected charge to the nodes 101 and 109. For some embodiments, the control voltage C2 may be used to switch the charge injection control elements 201, 203, 205 and 207 between ON and OFF states (e.g., as described below in reference to FIG. 4).

For improved performance, the charge injection control elements 201, 203, 205 and 207 should be designed to have an impedance sufficiently high to prevent degradation of the RF isolation performance of the SOI RF switch 200. However, the charge injection control elements 201, 203, 205 and 207 should also have an impedance sufficiently low to effectively remove the injected charge and avoid degradation of the switching time for the SOI RF switch 200. Further, in some embodiments, the charge injection control elements 201, 203, 205 and 207 are designed so that they do not cause nonlinear behavior and RF harmonic generation. In addition, it is desirable that the charge injection control elements 201, 203, 205 and 207 do not degrade the switching time of the SOI RF switch 200. These design tradeoffs are described in more detail below in reference to FIGS. 3 and 4.

Many configurations of charge injection control elements can be used to remove injected charge from resistively-isolated nodes between switching transistors in SOI RF switches.

SOI RF Switch Circuits with Charge Injection Control Circuits Using Resistors

Figure 3:
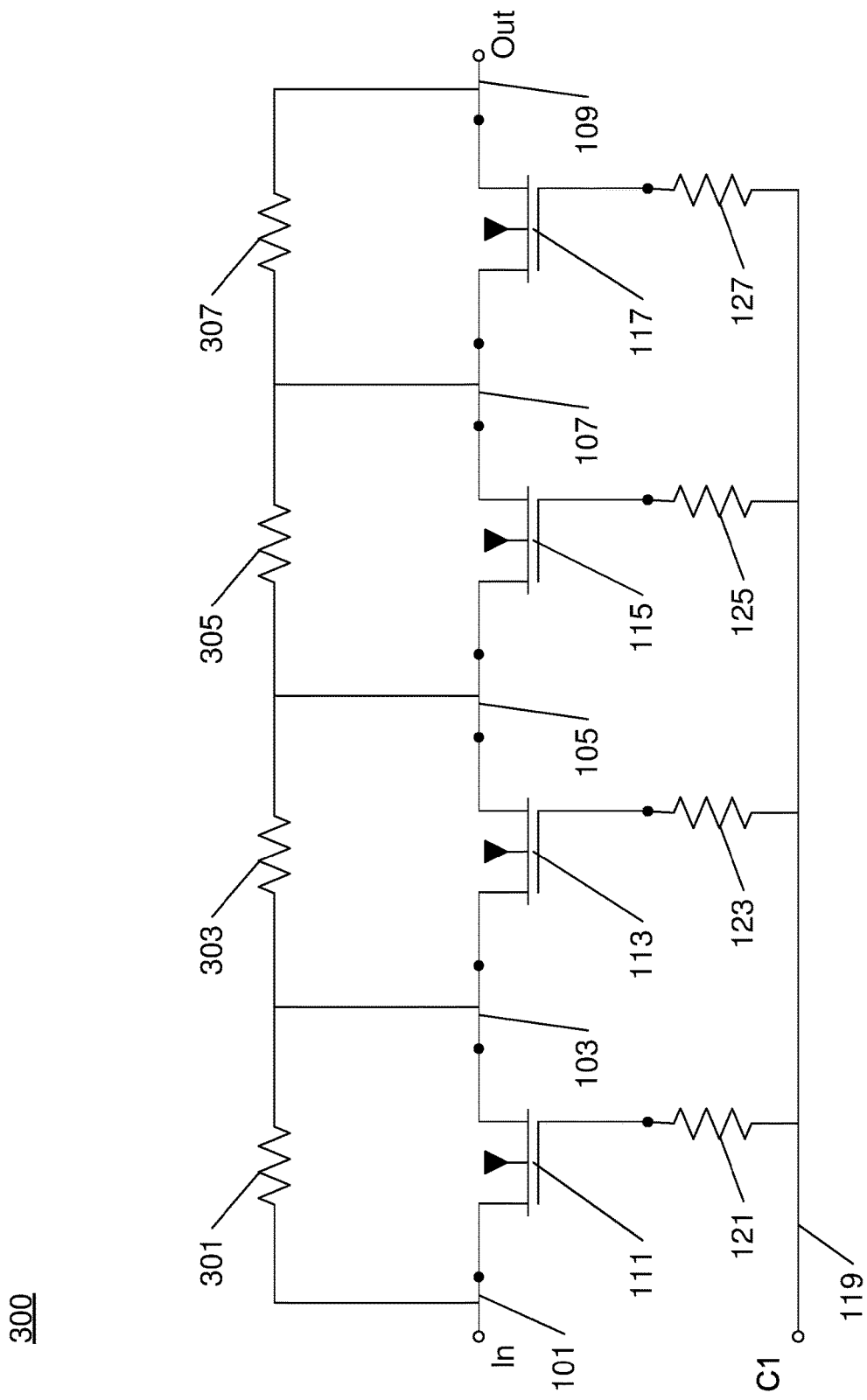
FIG. 3 shows a schematic illustration of an embodiment according to the present disclosure, using resistors in a charge injection control circuit.

An embodiment of a charge injection control circuit using resistors to remove injected charge in an SOI RF switch is illustrated in FIG. 3. In FIG. 3, an SOI RF switch 300 includes charge injection control resistors 301, 303, 305 and 307 that comprise elements of a charge injection control circuit. A first node of the charge injection control resistor 301 is operatively connected to the node 101, and a second node of the charge injection control resistor 301 is operatively connected to the node 103. Similarly, a first node of the charge injection control resistor 303 is operatively connected to the node 103, and a second node of the charge injection control resistor 303 is operatively connected to the node 105. Similarly, a first node of the charge injection control resistor 305 is operatively connected to the node 105, and a second node of the charge injection control resistor 305 is operatively connected to the node 107. Similarly, first node of the charge injection control resistor 307 is operatively connected to the node 107, and a second node of the charge injection control resistor 307 is operatively connected to the node 109. The charge injection control resistors 301, 303, 305 and 307 receive injected charge from the nodes 103, 105 and 107, and convey the injected charge to the nodes 101 and 109.

As noted above, for improved performance, the charge injection control resistors 301, 303, 305 and 307 are designed to have a sufficiently high resistance valve to prevent degradation of the RF isolation performance of the SOI RF switch 300. However, the charge injection control resistors 301, 303, 305 and 307 should also have a low enough resistance to effectively remove the injected charge. Using circuit simulation techniques, good performance has been determined for charge injection resistors selected according to the following equation:

$$Rc = Rg/N \quad \text{[EQUATION 1]}$$

In Equation 1, Rc is the resistance of each charge injection control resistor, Rg is the resistance of each gate resistor, and N is the number of RF switching transistors in the stack, also referred to as the "stack height". It has been determined that choosing the charge injection resistors according to EQUATION 1 provides minimal degradation to the isolation and switching time performance of the SOI RF switch. In one embodiment, SOI RF switch 300 may have gate resistors 121, 123, 125 and 127 that are each 100 K-ohm. In this embodiment, the charge injection control resistors 301, 303, 305 and 307 will each comprise 25 K-ohm resistors, because the stack height N=4 in this example. The present disclosure also encompasses use of charge injection control resistors having Rc values other than as indicated by EQUATION 1. For example, in some embodiments Rc may be selected in the range 10×Rg/N>Rc>Rg/10N.

U.S. application Ser. No. 11/484,370, filed Jul. 10, 2006, pending, incorporated by reference hereinabove, discloses using drain-to-source Rds resistors between the source and drain of a stacked SOI RF switch having an accumulated charge sink. Although the Rds resistors 802, 804, and 806 as shown in FIG. 8, of the U.S. application Ser. No. 11/484,370 have a configuration that is similar to the charge injection control resistors 301, 303, 305 and 307, their function and operation are distinct. In particular, the Rds resistors 802, 804, and 806 are included to allow removal of a DC current generated by using an accumulated charge sink, while the present disclosure provides a solution to the more general problem of charge injection in SOI RF switches that may or may not have an accumulated charge sink.

Charge Injection Control Circuit Using Transistors to Remove Injected Charge

Figure 4:
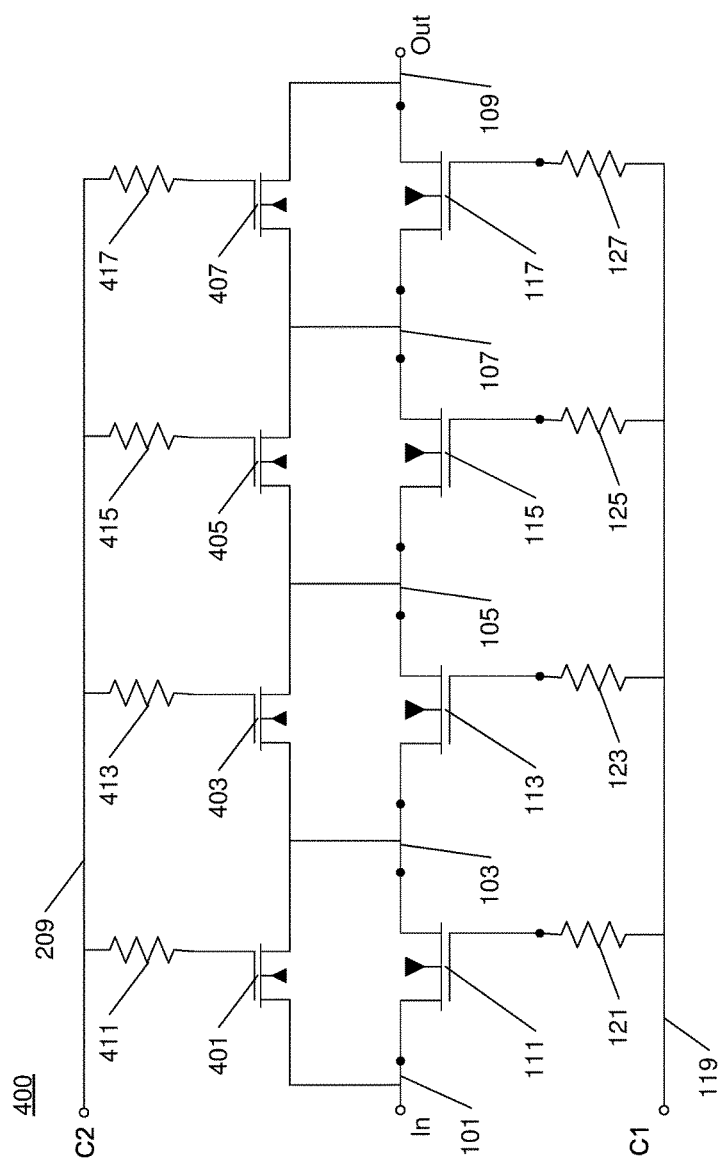
FIG. 4 shows a schematic illustration of an embodiment according to the present disclosure, using transistors in a charge injection control circuit.

An embodiment of a charge injection control circuit using transistors to remove injected charge in an SOI RF switch is illustrated by FIG. 4.

In FIG. 4 an SOI RF switch 400 includes charge injection control transistors 401, 403, 405 and 407 that comprise elements of a charge injection control circuit. A first and second channel node of the charge injection control transistor 401 are operatively connected to the nodes 101 and 103, respectively. Similarly, a first and second channel node of the charge injection control transistor 403 are operatively connected to the nodes 103 and 105, respectively. Similarly, a first and second channel node of the charge injection control transistor 405 are operatively connected to the nodes 105 and 107, respectively. Similarly, a first and second channel node of the charge injection control transistor 407 are operatively connected to the nodes 107 and 109, respectively.

The gates of the charge injection control transistors 401, 403, 405 and 407 are operatively connected to gate resistors 411, 413, 415 and 417, respectively. The gate resistors 411, 413, 415 and 417 are also connected to a control line 209 to receive a control signal C2 that is conveyed to the gates of the charge injection control transistors 401, 403, 405 and 407. The gate resistors 411, 413, 415 and 417 are included to enable voltage division of RF signals across the switching transistors, protect bias circuits, and prevent transmission of parasitic RF signals between the stacked switching transistors.

In one embodiment, in operation, the control signal C2 provides a voltage signal to maintain the charge injection control transistors 401, 403, 405 and 407 in an ON-state during time intervals in which the gate control signal C1 maintains the switching transistors 111, 113, 115 and 117 in an ON-state. For example, the transistors 401, 403, 405, 407, 111, 113, 115 and 117 may all be enhancement-mode n-channel MOSFETs with a threshold voltage of +0.1 V. The gate control signals C1 and C2 may be selected to vary between a voltage of +1.0 V to turn the transistors ON, and a voltage of −3.0 V to turn the transistors OFF.

When the gate control signal C1 transitions from +1 V to −3 V, the voltage passes through the switching transistor threshold voltage +0.1 V. If the gate control signal C2 is maintained at a voltage of +1 V for a time interval after the gate control signal C1 transitions from +1 V to −3 V, the nodes 103, 105 and 107 maintain low resistance connections to the nodes 101 and 109 via the ON-state charge injection control transistors 401, 403, 405 and 407. This low resistance connection conveys the injected charge from the nodes 103, 105 and 107 to the nodes 101 and 109, thereby controlling the charge injection process. After the switching transistors 111, 113, 115 and 117 are in the OFF-state, the charge injection control transistors 401, 403, 405 and 407 may be switched to the OFF-state by changing the gate control signal C2 from +1 V to −3 V.

In order to reduce charge injection via the charge injection control transistors 401, 403, 405 and 407 to the nodes 103, 105 and 107 that may occur when the charge injection control transistors 401, 403, 405 and 407 are switched OFF, the capacitances between the gate nodes and the channel nodes of the charge injection control transistors should be made smaller than the capacitances between the gate nodes and the channel nodes of the switching transistors. This may be accomplished by making the widths of the charge injection control transistors smaller than the widths of the switching transistors. For example, if the charge injection control transistors have a width Wc that is 0.1 times as large as a width Ws of the switching transistors, the charge injection magnitude will be smaller by a factor of approximately 0.1. At this level, the charge injection will be sufficiently small to not degrade performance for an SOI RF switch such the exemplary SOI RF switch 400.

Some advantages of using charge injection control transistors, rather than charge injection control resistors, are reduced switching time and improved switch isolation.

Charge Injection Control Method

Figure 5:
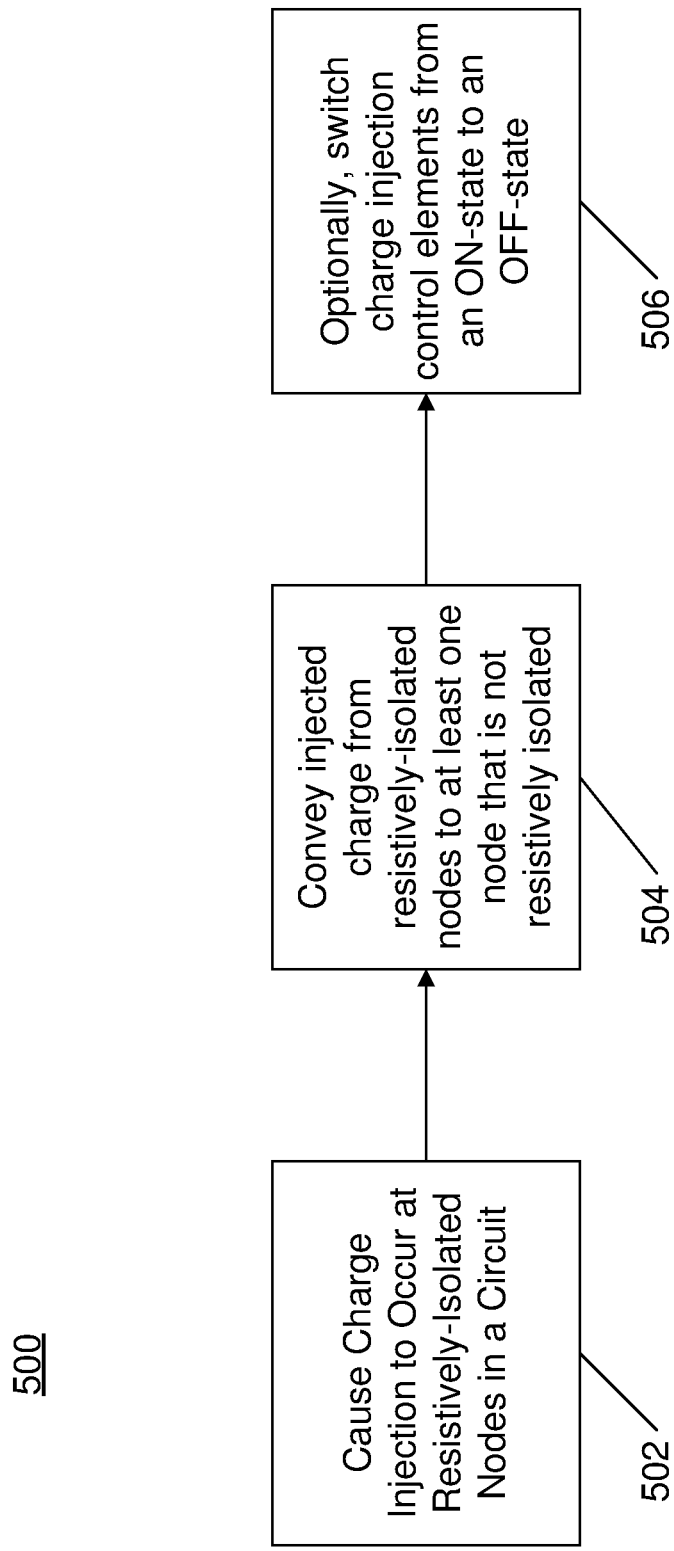
FIG. 5 is a flow chart diagram illustrating a charge injection control method.

In FIG. 5 a charge injection control method 500 is represented by a flow chart diagram. The method begins at a STEP 502, wherein charge injection is caused to occur at resistively isolated nodes of a circuit. In one embodiment, charge injection is generated in an SOI RF switch including stacked switching transistors when the RF switch is switched from an ON-state to an OFF-state. In this embodiment, the charge injection occurs at resistively-isolated nodes located between the switching transistors.

At a STEP 504, the injected charge is conveyed via charge injection control elements from the resistively-isolated nodes to at least one node that is not resistively-isolated. In one embodiment, the charge injection control elements may comprise charge injection control resistors. For this embodiment, the method stops at the STEP 504.

At an optional STEP 506, the charge injection control elements are switched from an ON-state to an OFF-state following a selected time delay interval after the switching transistors are switched from the ON-state to the OFF-state. For example, the STEP 506 is implemented in an embodiment wherein the charge injection control elements comprise charge injection control transistors.

Pulse Method for Controlling Accumulated Charge

As disclosed in U.S. application Ser. No. 11/484,370, filed Jul. 10, 2006, pending, and in U.S. application Ser. No. 11/520,912, filed Sep. 14, 2006, filed Sep. 15, 2005, both incorporated by reference hereinabove, accumulated charge can occur in MOSFET devices that are used in SOI RF switches. A MOSFET device is defined as operating within an "accumulated charge regime" when the MOSFET is biased to operate in an off-state, and when carriers having opposite polarity to the channel carriers are present in the channel region. Accumulated charge in the channel region can degrade the performance of MOSFETs used in SOI RF switches. In particular, the accumulated charge can cause harmonic generation in RF signals and degrade the gate oxide reliability of a MOSFET device.

Accumulated charge in an n-channel MOSFET results from a slow electron-hole pair generation process that occurs when a gate voltage Vg is negative with respect to a source bias voltage Vs and a drain bias voltage Vd. If a positive voltage pulse above a threshold voltage Vth is applied to the gate terminal of the MOSFET, a conducting channel comprising electrons is formed in the body of the MOSFET, and the accumulated charge is dissipated due to drift and recombination. When the gate voltage Vg returns to the negative bias level present prior to the application of the positive voltage pulse, the accumulated charge regenerates in a time period having a time scale that is typically in the millisecond range or longer. Consequently, the accumulated charge in the MOSFET may be controlled by applying a series of positive voltage pulses to the gate terminal. In one example, the pulse rate may be selected by observing harmonic generation in an applied RF signal, and selecting a pulse rate sufficiently high to prevent the harmonic generation from exceeding a desired level.

As a practical effect of applying the pulse method of controlling accumulated charge in an SOI RF switch, charge injection will occur each time the switching transistors are switched from an ON-state to an OFF-state. Consequently, the teachings of the present disclosure for controlling charge injection are also useful when used in conjunction with SOI RF switch systems employing the pulse method for controlling accumulated charge.

Embodiments Using Accumulated Charge Control (ACC) Switching Transistors

Embodiments according to the present teachings may, in some embodiments, use switching transistors (e.g., the switching transistors 111, 113, 115 and 117 of FIGS. 1A, 2, 3 and 4) having an accumulated charge sink (ACS) 610, as shown in FIGS. 6A-6D, and as described in greater detail in U.S. application Ser. No. 11/484,370, filed Jul. 10, 2006, pending, incorporated by reference hereinabove. For example, the switching transistors 111, 113, 115, and 117 (see FIGS. 3-4 and associated description above) may, in some embodiments, comprise accumulated charge control (ACC) transistors described in the above-incorporated application Ser. No. 11/484,370, filed Jul. 10, 2006, and shown in FIGS. 6A-6D. In another embodiment, the switching transistors 111, 113, 115, and 117 may comprise ACC transistors operated according to the pulse method for controlling accumulated charge, as described above and as described in greater detail in the above-incorporated application Ser. No. 11/520,912, filed Sep. 14, 2006.

As shown in FIGS. 6A-6D, in an improved ACC SOI NMOSFET 600, a gate terminal 602 is electrically coupled to a gate 601, a source terminal 604 is electrically coupled to a source 603, and a drain terminal 606 is electrically coupled to a drain 605. Finally, the ACC MOSFET 600 includes an ACS terminal 608 that is electrically coupled to the ACS 610.

Figure 6A:
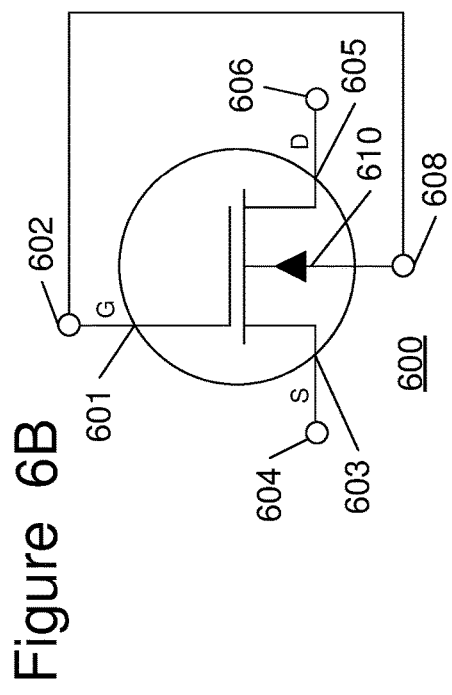
FIG. 6A is a simplified schematic of an improved SOI NMOSFET adapted to control accumulated charge embodied as a four terminal device.
Figure 6B:
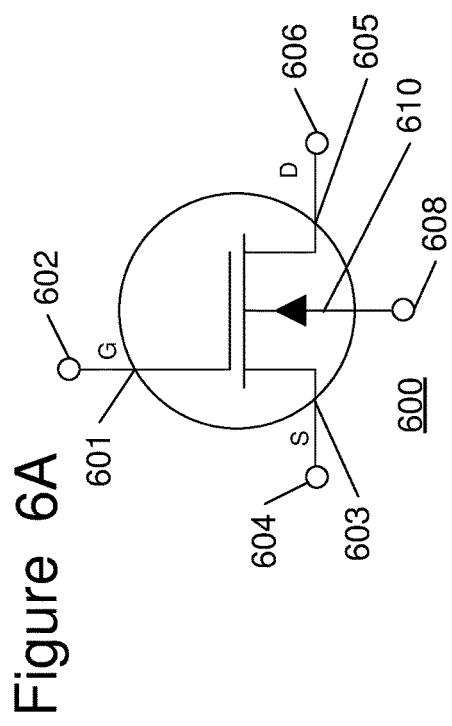
FIG. 6B is a simplified schematic of an improved SOI NMOSFET adapted to control accumulated charge, embodied as a four terminal device, wherein an accumulated charge sink (ACS) terminal is coupled to a gate terminal.

The ACC SOI NMOSFET 600 may be operated using various techniques and implemented in various circuits in order to control accumulated charge present in the FET when it is operating in an accumulated charge regime. For example, in one exemplary embodiment as shown in FIG. 6B, the gate and ACS terminals, 602 and 608, respectively, are electrically coupled together. In one embodiment of the simplified circuit shown in FIG. 6B, the source and drain bias voltages applied to the terminals 604 and 606, respectively, may be zero. If the gate bias voltage (Vg) applied to the gate terminal 602 is sufficiently negative with respect to the source and drain bias voltages (Vs and Vd, respectively) applied to the terminals 604 and 606, and with respect to the threshold voltage $V_{th}$, (for example, if $V_{th}$ is approximately zero, and if Vg is more negative than approximately −1 V) the ACC NMOSFET 600 operates in the accumulated charge regime. When the MOSFET operates in this regime, accumulated charge (holes) may accumulate in the NMOSFET 600.

Advantageously, the accumulated charge can be removed via the ACS terminal 608 by connecting the ACS terminal 608 to the gate terminal 602 as shown in FIG. 6B. This configuration ensures that when the FET 600 is operated in the OFF-state, it is held in the correct bias region to effectively remove or otherwise control the accumulated charge. As shown in FIG. 6B, connecting the ACS terminal 608 to the gate ensures that the same bias voltages are applied to both the gate (Vg) and the ACS 610 ($V_{ACS}$). The accumulated charge is thereby removed from the SOI NMOSFET 600 via the ACS terminal 608.

In other exemplary embodiments, as described with reference to FIG. 6C, for example, Vs and Vd may comprise nonzero bias voltages. According to these examples, Vg must be sufficiently negative to both Vs and Vd in order for Vg to be sufficiently negative to $V_{th}$ to turn the NMOSFET 600 OFF (i.e., operate the NMOSFET 600 in the OFF-state). When so biased, as described above, the NMOSFET 600 may enter the accumulated charge regime. For this example, the voltage $V_{ACS}$ may also be selected to be equal to Vg by connecting the ACS terminal 608 to the gate terminal 602, thereby conveying the accumulated charge from the ACC NMOSFET, as described above.

Figure 6C:
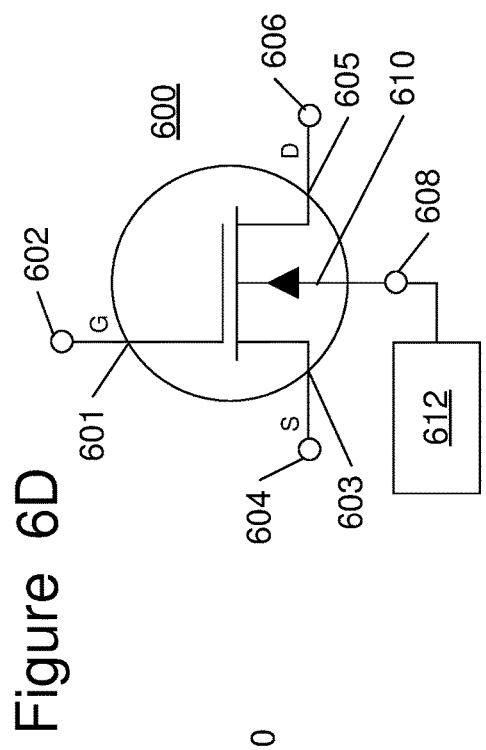
FIG. 6C is a simplified schematic of an improved SOI NMOSFET adapted to control accumulated charge, embodied as a four terminal device, wherein an accumulated charge sink (ACS) terminal is coupled to a gate terminal via a diode.

Another exemplary simplified circuit using the improved ACC SOI NMOSFET 600 is shown in FIG. 6C. As shown in FIG. 6C, in this embodiment, the ACS terminal 608 may be electrically coupled to a diode 610, and the diode 610 may, in turn, be coupled to the gate terminal 602. This embodiment may be used to prevent a positive current flow into the ACS 610 caused by a positive Vg-to-Vs (or, equivalently, Vgs, where Vgs=Vg−Vs) bias voltage, as may occur, for example, when the SOI NMOSFET 300 is biased into an ON-state condition.

As with the device shown in FIG. 6B, when biased OFF, the ACS terminal 608 voltage $V_{ACS}$ comprises the gate voltage plus a voltage drop across the diode 610. At very low ACS terminal 610 current levels, the voltage drop across the diode 610 typically also is very low (e.g., <<500 mV, for example, for a typical threshold diode).

When the SOI NMOSFET 600 is biased in an ON-state condition, the diode 610 is reverse-biased, thereby preventing the flow of positive current into the source and drain regions. The reverse-biased configuration reduces power consumption and improves linearity of the device. The circuit shown in FIG. 6C therefore works well to remove the accumulated charge when the FET is in the OFF-state and is operated in the accumulated charge regime. It also permits almost any positive voltage to be applied to the gate voltage Vg. This, in turn, allows the ACC MOSFET to effectively remove accumulated charge when the device operates in the OFF-state, yet assume the characteristics of a floating body device when the device operates in the ON-state.

With the exception of the diode 610 used to prevent the flow of positive current into the ACS terminal 608, exemplary operation of the simplified circuit shown in FIG. 6C is the same as the operation of the circuit described above with reference to FIG. 6B.

Figure 6D:
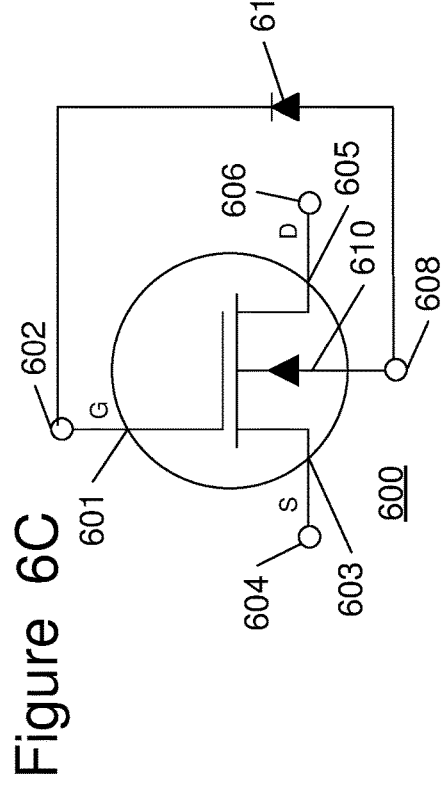
FIG. 6D is a simplified schematic of an improved SOI NMOSFET adapted to control accumulated charge, embodied as a four terminal device, wherein an accumulated charge sink (ACS) terminal is coupled to a control circuit.

In yet another embodiment, the ACS terminal 608 may be coupled to a control circuit 612 as illustrated in the simplified circuit of FIG. 6D. The control circuit 612 may provide a selectable ACS bias voltage $V_{ACS}$ that selectively controls the accumulated charge.

Method of Fabrication

With varying performance results, RF switches have heretofore been implemented in different component technologies, including bulk complementary-metal-oxide-semiconductor (CMOS) and gallium-arsenide (GaAs) technologies. In fact, most high-performance high-frequency switches use GaAs technology.

Although GaAs RF switch implementations offer improved performance characteristics relative to bulk CMOS, the technology has several disadvantages. For example, GaAs technology exhibits relatively low yields of properly functioning integrated circuits. GaAs RF switches tend to be relatively expensive to design and manufacture. In addition, although GaAs switches exhibit improved insertion loss characteristics as described above, they may have low frequency limitations due to slow states present in the GaAs substrate. The technology also does not lend itself to high levels of integration, which requires that digital control circuitry associated with the RF switch be implemented "off chip" from the switch. The low power control circuitry associated with the switch has proven difficult to integrate. This is disadvantageous as it both increases the overall system cost or manufacture, size and complexity, as well as reducing system throughput speeds.

In one embodiment of the present disclosure, the exemplary circuits described hereinabove are implemented using a fully insulating substrate silicon-on-insulator (SOI) technology. More specifically, the MOSFET transistors of the present disclosure are implemented using "Ultra-Thin-Silicon (UTSi)" (also referred to herein as "ultrathin silicon-on-sapphire") technology. In accordance with UTSi manufacturing methods, the transistors used to implement the inventive RF switch are formed in an extremely thin layer of silicon in an insulating sapphire wafer. The fully insulating sapphire substrate enhances the performance characteristics of the inventive RF switch by reducing the deleterious substrate coupling effects associated with non-insulating and partially insulating substrates. For example, improvements in insertion loss are realized by lowering the transistor ON-state resistances and by reducing parasitic substrate conductances and capacitances. In addition, switch isolation is improved using the fully insulating substrates provided by UTSi technology. Owing to the fully insulating nature of silicon-on-sapphire technology, the parasitic capacitance between the nodes of the RF switches are greatly reduced as compared with bulk CMOS and other traditional integrated circuit manufacturing technologies.

Silicon on Insulator RF Integrated Circuits

As is well known, SOI has been used in the implementation of high performance microelectronic devices, primarily in applications requiring radiation hardness and high speed operation. SOI technologies include, for example, SIMOX, bonded wafers having a thin silicon layer bonded to an insulating layer, and silicon-on-sapphire. In order to achieve the desired RF switch performance characteristics described hereinabove, in one embodiment, the inventive RF switch is fabricated on a sapphire substrate.

Fabrication of devices on an insulating substrate requires that an effective method for forming silicon CMOS devices on the insulating substrate be used. The advantages of using a composite substrate comprising a monocrystalline semiconductor layer, such as silicon, epitaxially deposited on a supporting insulating substrate, such as sapphire, are well-recognized, and can be realized by employing as the substrate an insulating material, such as sapphire ($Al_2O_3$), spinel, or other known highly insulating materials, and providing that the conduction path of any inter-device leakage current must pass through the substrate.

An "ideal" SOI wafer can be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or re-growth schemes.

It has been found that the high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950 degrees C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Self-aligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Using the methods described in the patents referenced above, electronic devices can be formed in an extremely thin layer of silicon on an insulating synthetic sapphire wafer. The thickness of the silicon layer is typically less than 150 nm. Such an "ultrathin" silicon layer maximizes the advantages of the insulating sapphire substrate and allows the integration of multiple functions on a single integrated circuit. Traditional transistor isolation wells required for thick silicon are unnecessary, simplifying transistor processing and increasing circuit density. To distinguish these above-referenced methods and devices from earlier thick-silicon embodiments, they are herein referred to collectively as "ultrathin silicon-on-sapphire."

In some embodiments of the present disclosure, the MOS transistors may be formed in ultrathin silicon-on-sapphire wafers by the methods disclosed in U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. However, other known methods of fabricating silicon-on-sapphire integrated circuits can be used without departing from the spirit or scope of the present teachings.

A number of embodiments of the present inventive concept have been described. Nevertheless, it will be understood that various modifications may be made without departing from the scope of the inventive teachings. For example, it should be understood that many types of switch circuits (e.g., single-pole single-throw, single-pole double-throw, double-throw-pole double-throw, etc.) may be used according to the present teachings. In another example, it should be noted that although embodiments having SOI RF switches have been used herein for exemplary purposes, persons skilled in the electronic arts will understand that the present teachings may be applied to many other types of switching circuits having isolated nodes wherein charge injection may occur.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A switch circuit, comprising:
   (a) a plurality of switching transistors, each having a gate configured to be coupled to a gate control signal and a gate-controlled channel, coupled in series through their respective gate-controlled channels to selectively convey a signal from an input of the series coupled switching transistors to an output of the series coupled switching transistors, the series of switching transistors including:
      (1) at least one resistively-isolated node, each resistively-isolated node located between a different pair of the plurality of switching transistors in series; and
      (2) at least one non-resistively-isolated node located adjacent to one of the plurality of switching transistors in series;
   and
   (b) a plurality of charge injection control transistors, each control transistor having a gate configured to be coupled to a charge injection control signal and a gate-controlled channel operatively coupled between a corresponding one of the at least one resistively-isolated node and the at least one non-resistively-isolated node to selectively convey injected charge from the corresponding resistively-isolated node to the at least one non-resistively-isolated node;
   wherein each control transistor selectively switches between an OFF-state and an ON-state in response to application of the charge injection control signal, and conveys injection charge only while in the ON-state.

2. The switch circuit of claim 1, wherein when the series of switching transistors are switched from an ON-state to an OFF-state, the control transistors are switched from the ON-state to the OFF-state in response to application of the control signal after a selected delay time interval.

3. The switch circuit of claim 1, wherein each control transistor has a width Wc substantially smaller than a width Ws of an associated and corresponding switching transistor such that the capacitance between the gate and the channel of each control transistor is substantially smaller than the capacitance between the gate and the channel of the associated and corresponding switching transistor.

4. The switch circuit of claim 3, wherein Wc is approximately 0.1 as large as Ws.

5. The switch circuit of claim 1, wherein each of the switching transistors comprises an accumulated charge control (ACC) transistor.

6. The switch circuit of claim 5, wherein the ACC transistor includes an accumulated charge sink (ACS) electrically coupled to convey accumulated charge from the ACS to a gate terminal of the ACC transistor when the ACC transistor operates in an accumulated charge regime.

7. The switch circuit of claim 6, wherein a diode selectively conveys accumulated charge from the ACS to the gate terminal of the ACC transistor when the ACC transistor operates in an accumulated charge regime.

8. The switch circuit of claim 1, wherein the switching transistors are enhancement-mode n-channel MOSFETs.

9. The switch circuit of claim 1, wherein the control transistors are enhancement-mode n-channel MOSFETs.

10. A method of controlling charge injection in a switch circuit, including:
   (a) employing a plurality of switching transistors, each having a gate configured to be coupled to a gate control signal and a gate-controlled channel, and being coupled in series through their respective gate-controlled channels, to selectively convey a signal from an input of the series coupled switching transistors to an output of the series coupled switching transistors; the series of switching transistors including:
  (1) at least one resistively-isolated node, each resistively-isolated node located between a different pair of the plurality of switching transistors in series; and
  (2) at least one non-resistively-isolated node located adjacent to one of the plurality of switching transistors in series;
(b) generating injected charge at each resistively-isolated node;
(c) operatively coupling one of a plurality of charge injection control transistors, each control transistor having a gate configured to be coupled to a charge injection control signal and a gate-controlled channel, between a corresponding one of the at least one resistively-isolated node and the at least one non-resistively-isolated node to selectively convey injected charge from the corresponding resistively-isolated node to the at least one non-resistively-isolated node; and
(d) selectively switching each control transistor between an OFF-state and an ON-state in response to application of the charge injection control signal, and conveying injection charge only while in the ON-state.

11. The method of claim 10, further including:
(a) switching the series of switching transistors from an ON-state to an OFF-state; and
(b) switching the control transistors from the ON-state to the OFF-state in response to application of the control signal after a selected delay time interval after the series of switching transistors is switched to the OFF-state.

12. The method of claim 10, wherein each control transistor has a width Wc substantially smaller than a width Ws of an associated and corresponding switching transistor such that the capacitance between the gate and the channel of each control transistor is substantially smaller than the capacitance between the gate and the channel of the associated and corresponding switching transistor.

13. The method of claim 12, wherein Wc is approximately 0.1 as large as Ws.

14. The method of claim 10, wherein each of the switching transistors comprises an accumulated charge control (ACC) transistor.

15. The method of claim 14, wherein the ACC transistor includes an accumulated charge sink (ACS) electrically coupled to convey accumulated charge from the ACS to a gate terminal of the ACC transistor when the ACC transistor operates in an accumulated charge regime.

16. The method of claim 15, wherein a diode selectively conveys accumulated charge from the ACS to the gate terminal of the ACC transistor when the ACC transistor operates in an accumulated charge regime.

17. The method of claim 10, wherein the switching transistors are enhancement-mode n-channel MOSFETs.

18. The method of claim 10, wherein the control transistors are enhancement-mode n-channel MOSFETs.

19. A switch circuit, including:
(a) a plurality of switching transistors, each having a gate configured to be coupled to a gate control signal and a gate-controlled channel, coupled in series through their respective gate-controlled channels to selectively convey a signal from an input of the series coupled switching transistors to an output of the series coupled switching transistors; the series of switching transistors including:
  (1) a plurality of gate resistors, wherein a gate of each switching transistor is connected to a corresponding one of the plurality of gate resistors, and wherein each gate resistor is connected to a control line that conveys a control signal to the gate of each corresponding switching transistor;
  (2) at least one resistively-isolated node, each resistively-isolated node located between a different pair of the plurality of switching transistors in series; and
  (3) at least one non-resistively-isolated node located adjacent to one of the plurality of switching transistors in series;
(b) means for generating injected charge at each resistively-isolated node; and
(c) control transistor switching means, operatively coupled to the generating means, each control transistor switching means having a gate configured to be coupled to a charge injection control signal and a gate-controlled channel, for selectively conveying injected charge from a corresponding one of the at least one resistively-isolated node to the at least one non-resistively-isolated node;
wherein each control transistor switching means selectively switches between an OFF-state and an ON-state in response to application of the charge injection control signal, and conveys injection charge only while in the ON-state.

20. The switch circuit of claim 19, further including:
(a) means for switching the series of switching transistors from an ON-state to an OFF-state; and
(b) means for switching the control transistor switching means from the ON-state to the OFF-state in response to application of the control signal after a selected delay time interval after the series of switching transistors is switched to the OFF-state.

21. The switch circuit of claim 19, wherein each control transistor switching means has a width Wc substantially smaller than a width Ws of an associated and corresponding switching transistor such that the capacitance between the gate and the channel of each control transistor switching means is substantially smaller than the capacitance between the gate and the channel of the associated and corresponding switching transistor.

22. The switch circuit of claim 21, wherein Wc is approximately 0.1 as large as Ws.

23. The switch circuit of claim 19, wherein each of the switching transistors comprises an accumulated charge control (ACC) transistor.

24. The switch circuit of claim 23, wherein the ACC transistor includes an accumulated charge sink (ACS) electrically coupled to convey accumulated charge from the ACS to a gate terminal of the ACC transistor when the ACC transistor operates in an accumulated charge regime.

25. The switch circuit of claim 24, wherein a diode selectively conveys accumulated charge from the ACS to the gate terminal of the ACC transistor when the ACC transistor operates in an accumulated charge regime.

26. The switch circuit of claim 19, wherein the switching transistors are enhancement-mode n-channel MOSFETs.

27. The switch circuit of claim 19, wherein the control transistors are enhancement-mode n-channel MOSFETs.

28. A radio-frequency (RF) signal switching circuit implemented as a monolithic integrated circuit (IC) on a semiconductor-on-insulator (SOI) substrate, including:
(a) a plurality of signal switching MOSFET transistors, each MOSFET transistor having (A) a gate coupled to a gate resistor configured to be coupled to a gate control signal, each gate resistor having a resistance of approximately Rg, and (B) a gate-controlled channel, wherein the plurality of signal switching MOSFET transistors are coupled in series through their respective gate-controlled channels to selectively convey, in response to the gate control signal, an RF signal from an input of the series-coupled signal switching MOSFET transistors to an output of the series-coupled signal switching MOSFET transistors, the series-coupled signal switching MOSFET transistors further including:
(1) at least one resistively-isolated node, each resistively-isolated node located between a different pair of the series-coupled signal switching MOSFET transistors and receiving injected charge when the plurality of series-coupled signal switching MOSFET transistors is switched from an ON state to an OFF state; and
(2) at least one non-resistively-isolated node located adjacent to one of the plurality series-coupled signal switching MOSFET transistors;
and
(b) a plurality of charge injection control resistors, each charge injection control resistor operatively coupled between a corresponding one of the at least one resistively-isolated node and the at least one non-resistively-isolated node to convey received injected charge from the corresponding resistively-isolated node to the at least one non-resistively-isolated node, each charge injection control resistor having a resistance Rc approximately equal to Rg/N, wherein N is the number of transistors in the plurality of series-coupled signal switching MOSFET transistors.

29. The RF signal switching circuit of claim 28, wherein each of the switching transistors comprises an accumulated charge control (ACC) transistor.

30. The RF signal switching circuit of claim 29, wherein the ACC transistor includes an accumulated charge sink (ACS) electrically coupled to convey accumulated charge from the ACS to a gate terminal of the ACC transistor when the ACC transistor operates in an accumulated charge regime.

31. The RF signal switching circuit of claim 30, wherein a diode selectively conveys accumulated charge from the ACS to the gate terminal of the ACC transistor when the ACC transistor operates in an accumulated charge regime.

32. The RF signal switching circuit of claim 28, wherein the switching transistors are enhancement-mode n-channel MOSFETs.

33. A radio-frequency (RF) signal switching circuit implemented as a monolithic integrated circuit (IC) on a semiconductor-on-insulator (SOI) substrate, including:
(a) a plurality of signal switching MOSFET transistors, each MOSFET transistor having (A) a gate coupled to a gate resistor configured to be coupled to a gate control signal, and (B) a gate-controlled channel, wherein the plurality of signal switching MOSFET transistors are coupled in series through their respective gate-controlled channels to selectively convey, in response to the gate control signal, an RF signal from an input of the series-coupled signal switching MOSFET transistors to an output of the series-coupled signal switching MOSFET transistors, the series-coupled signal switching MOSFET transistors further including:
(1) at least one resistively-isolated node, each resistively-isolated node located between a different pair of the series-coupled signal switching MOSFET transistors and receiving injected charge when the plurality of series-coupled signal switching MOSFET transistors is switched from an ON state to an OFF state; and
(2) at least one non-resistively-isolated node located adjacent to one of the plurality series-coupled signal switching MOSFET transistors;
and
(b) a plurality of charge injection control resistors, each charge injection control resistor operatively coupled between a corresponding one of the at least one resistively-isolated node and the at least one non-resistively-isolated node to convey received injected charge from the corresponding resistively-isolated node to the at least one non-resistively-isolated node, each charge injection control resistor having an impedance sufficiently high to prevent degradation of the RF isolation performance of the RF signal switching circuit and sufficiently low to effectively remove the received injected charge.

34. The RF signal switching circuit of claim 33, wherein each gate resistor has a resistance of approximately Rg, and the impedance of each charge injection control resistor is in the range of about Rg/10 N to about 10×Rg/N, wherein N is the number of transistors in the plurality of series-coupled signal switching MOSFET transistors.

35. The RF signal switching circuit of claim 33, wherein each gate resistor has a resistance of approximately Rg, and the impedance of each charge injection control resistor is greater than or equal to Rg/N, wherein N is the number of transistors in the plurality of series-coupled signal switching MOSFET transistors.

36. The RF signal switching circuit of claim 33, wherein each gate resistor has a resistance of approximately Rg, and the impedance of each charge injection control resistor is approximately equal to Rg/N, wherein N is the number of transistors in the plurality of series-coupled signal switching MOSFET transistors.

37. The RF signal switching circuit of claim 33, wherein each of the switching transistors comprises an accumulated charge control (ACC) transistor.

38. The RF signal switching circuit of claim 37, wherein the ACC transistor includes an accumulated charge sink (ACS) electrically coupled to convey accumulated charge from the ACS to a gate terminal of the ACC transistor when the ACC transistor operates in an accumulated charge regime.

39. The RF signal switching circuit of claim 37, wherein a diode selectively conveys accumulated charge from the ACS to the gate terminal of the ACC transistor when the ACC transistor operates in an accumulated charge regime.

40. The RF signal switching circuit of claim 33, wherein the MOSFET transistors are enhancement-mode n-channel MOSFETs.

41. A radio-frequency (RF) signal switching circuit implemented as a monolithic integrated circuit (IC) on a semiconductor-on-insulator (SOI) substrate, including:
(a) a plurality of signal switching MOSFET transistors, each MOSFET transistor having (A) a gate coupled to a gate resistor configured to be coupled to a gate control signal, and (B) a gate-controlled channel, wherein the plurality of signal switching MOSFET transistors are coupled in series through their respective gate-controlled channels to selectively convey, in response to the gate control signal, an RF signal from an input of the series-coupled signal switching MOSFET transistors to an output of the series-coupled signal switching MOSFET transistors, the series-coupled signal switching MOSFET transistors further including at least one resistively-isolated inner node, each inner node located between adjacent pairs of the series-coupled signal switching MOSFET transistors and receiving injected charge when the plurality of series-coupled signal switching MOSFET transistors is switched from an ON state to an OFF state; and (b) a plurality of charge injection control resistors, each charge injection control resistor operatively coupled between a corresponding inner node and at least one of the input or the output to convey received injected charge from the corresponding inner node to the input and/or the output, each charge injection control resistor having an impedance sufficiently high to prevent degradation of the RF isolation performance of the RF signal switching circuit and sufficiently low to effectively remove the received injected charge.

42. The RF signal switching circuit of claim 41, wherein each gate resistor has a resistance of approximately Rg, and the impedance of each charge injection control resistor is in the range of about Rg/10 N to about 10×Rg/N, wherein N is the number of transistors in the plurality of series-coupled signal switching MOSFET transistors.

43. The RF signal switching circuit of claim 41, wherein each gate resistor has a resistance of approximately Rg, and the impedance of each charge injection control resistor is greater than or equal to Rg/N, wherein N is the number of transistors in the plurality of series-coupled signal switching MOSFET transistors.

44. The RF signal switching circuit of claim 41, wherein each gate resistor has a resistance of approximately Rg, and the impedance of each charge injection control resistor is approximately equal to Rg/N, wherein N is the number of transistors in the plurality of series-coupled signal switching MOSFET transistors.

45. The RF signal switching circuit of claim 41, wherein each of the switching transistors comprises an accumulated charge control (ACC) transistor.

46. The RF signal switching circuit of claim 45, wherein the ACC transistor includes an accumulated charge sink (ACS) electrically coupled to convey accumulated charge from the ACS to a gate terminal of the ACC transistor when the ACC transistor operates in an accumulated charge regime.

47. The RF signal switching circuit of claim 46, wherein a diode selectively conveys accumulated charge from the ACS to the gate terminal of the ACC transistor when the ACC transistor operates in an accumulated charge regime.

48. The RF signal switching circuit of claim 41, wherein the MOSFET transistors are enhancement-mode n-channel MOSFETs.

* * * * *